(12) United States Patent
Liang

(10) Patent No.: US 10,578,675 B2
(45) Date of Patent: Mar. 3, 2020

(54) ESTIMATION METHOD FOR BATTERY CAPACITY

(71) Applicant: STL Technology Co., Ltd., Kaohsiung (TW)

(72) Inventor: Fang-Rui Liang, Kaohsiung (TW)

(73) Assignee: STL TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/145,871

(22) Filed: Sep. 28, 2018

(65) Prior Publication Data

US 2019/0227127 A1   Jul. 25, 2019

(30) Foreign Application Priority Data

Jan. 19, 2018 (CN) .......................... 2018 1 0054700

(51) Int. Cl.
*G01R 31/36* (2019.01)
*H02J 7/00* (2006.01)
*G01R 31/392* (2019.01)
*G01R 31/367* (2019.01)

(52) U.S. Cl.
CPC ....... *G01R 31/3648* (2013.01); *G01R 31/367* (2019.01); *G01R 31/392* (2019.01); *H02J 7/0047* (2013.01); *H02J 7/0068* (2013.01)

(58) Field of Classification Search
CPC .... G01R 31/367; G01R 31/392; H02J 7/0068
See application file for complete search history.

(56) References Cited

U.S. PATENT DOCUMENTS

| | | | | |
|---|---|---|---|---|
| 6,498,459 B1* | 12/2002 | Okumura | ............... | H02J 7/0068 320/127 |
| 2013/0030784 A1* | 1/2013 | Viassolo | ................ | G06Q 10/00 703/18 |
| 2013/0124121 A1* | 5/2013 | Hariharasudhan | .......................... | G01R 31/3842 702/63 |
| 2015/0244193 A1* | 8/2015 | Wang | .................... | H02J 7/0029 320/132 |

* cited by examiner

*Primary Examiner* — Alvaro E Fortich
(74) *Attorney, Agent, or Firm* — Chun-Ming Shih

(57) ABSTRACT

The invention provides a method for estimating a battery capacity of an electronic device. When a current or an average current of the battery is zero, a reference capacity is inquired from a look-up table based on a voltage of the battery. When a previously remaining capacity is greater than a reference capacity, a deduction process of a self-consumable capacity is performed one or more times for a previously recorded remaining capacity to obtain a new recorded remaining capacity smaller than the reference capacity. When the current of the battery is less than zero, a deduction process of a count capacity of discharging is performed one or more times for the previously recorded remaining capacity until a power of the battery is exhausted to obtain a first offset capacity. The first offset capacity is deducted from a previously recorded full charge capacity to estimate a new full charge capacity.

8 Claims, 4 Drawing Sheets

ESTIMATION METHOD FOR BATTERY CAPACITY

This non-provisional application claims priority claim under 35 U.S.C. § 119 (a) on China Patent Application No. 201810054700.7 filed Jan. 19, 2018, the entire contents of which are incorporated herein by reference.

FIELD OF THE INVENTION

The present invention relates to an estimation method, particularly to a method for estimating a remaining capacity and a full charge capacity of battery.

BACKGROUND

With the evolution of battery technology, many electronic devices are usually configured with a battery therein. The energy required for the operation of the electronic device can be provided by the electrical quantity stored in the battery. The electrical quantity stored in the battery will gradually decrease with the operation of the electronic device. In order to prevent that the electrical quantity of the electronic device is completely depleted and the operation of the electronic device is stopped without warning, many electronic devices are having a function of estimating the remaining capacity of the battery of itself. By the estimation of the remaining capacity of the battery, the user of the electronic device can perform charging on the battery when the electrical quantity of the battery is insufficient.

The method of the look-up table, for example, OVC lookup table, is often adopted for estimating the remaining capacity of the battery. The battery has a characteristic that a specific voltage will correspond to a specific capacity. The OVC lookup table lists each of battery capacities that is corresponding to each of voltages. A corresponding capacity of battery can be found from the voltage look-up table based on the detection of the current battery voltage. Although the OVC look-up table method can estimate the battery capacity quickly and simply, the voltage of the battery in use is easy to flutter, for example, the voltage will drop suddenly and then rise back slowly when the battery just starts to discharge, or the voltage will rise suddenly and then drop back slowly when the battery just starts to charge. Accordingly, the battery voltage generates a sharp change at a specific time based on the charge or discharge of the battery, so that the battery capacity estimated by the OVC look-up table method will be inaccurate. Furthermore, the battery will gradually generate physical aging with the use of time, such that the storage capability of the battery is getting worse; but, the OVC look-up table method is unable to forecast the aging of battery, resulting in the estimation of battery capacity that is more inaccurate.

SUMMARY

It is one objective of the present invention to provide an estimation method of battery capacity, which is applied in an electronic device having a battery. When an estimating program of battery capacity performs a process for estimating a remaining capacity of the battery, it can correct a recorded remaining capacity by a lookup table and a self-consumable capacity so that the estimation of the remaining capacity of the battery can be accurate. When the estimating program of battery capacity performs a process for estimating a fully charged capacity, it can calculate an offset capacity, during the discharging or during the charging, by the remaining capacity estimated and the coulomb counting method, and offset the full charged capacity that was erroneously recorded in previously by the use of the offset capacity so that the estimation of the full charged capacity can be more accurate.

To achieve the above object, the present invention provides an estimating method for battery capacity, which is applied in an electronic device having a battery, the estimating method comprising steps of: determining whether a current or an average current of the battery is zero, if so, performing a process of estimating a remaining capacity, and if not, performing a process of estimating a full charge capacity; performing the process of estimating the remaining capacity, comprising: detecting a voltage of the battery; inquiring a reference capacity from a lookup table based on the detected voltage of the battery; and determining whether a previously recorded remaining capacity is less than the reference capacity, returning to the step of determining whether the current or the average current of the battery is zero when the previously recorded remaining capacity is less than the reference capacity, performing a deduction process of a self-consumable capacity at least once for the previously recorded remaining capacity when the previously recorded remaining capacity is greater than the reference capacity so as to obtain a new recorded remaining capacity that is less than the reference capacity, or returning to the step of determining whether the current or the average current of the battery is zero when the deduction process of the self-consumable capacity has finished; and performing the process of estimating the full charge capacity, comprising: performing a discharging process for the battery; counting an electric charge capacity discharged by the battery by a coulomb counting method to obtain a count capacity of discharging and deducting the count capacity of discharging from the previously recorded remaining capacity to obtain the new recorded remaining capacity; determining whether a power of the battery is exhausted, if so, the new recorded remaining capacity to be regarded as a first offset capacity, if not, continuing to perform the discharging of the battery and deducting the count capacity of discharging from the previously recorded remaining capacity to update the new recorded remaining capacity; and deducting the first offset capacity from a previously recorded full charge capacity to estimate a new full charge capacity.

In one embodiment of the present invention, further comprising the following step: determining whether the current of the battery is less than zero, if so, indicating that the battery is performing the discharging process, and if not, indicating that the battery is performing a charging process.

In one embodiment of the present invention, the step in which the battery is performing the charging process comprising: counting the electric charge capacity for charging the battery by the coulomb counting method to obtain a count capacity of charging and adding the count capacity of charging to the previously recorded remaining capacity to obtain the new recorded remaining capacity; determines whether the battery is fully charged, if so, deducting the previously recorded full charge capacity from the new recorded remaining capacity to obtain a second offset capacity, and if not, continuing to perform the charging of the battery and adding the count capacity of charging to the previously recorded remaining capacity to update the new recorded remaining capacity; and adding the second offset capacity to the previously recorded full charge capacity to estimate the new full charge capacity.

In one embodiment of the present invention, further comprising the following steps: detecting an operation temperature of the battery; and inquiring the reference capacity from the lookup table based on the detected voltage of the battery and the detected operation temperature of the battery.

In one embodiment of the present invention, further comprising the following steps: inquiring the reference capacity from the lookup table based on the detected voltage of the battery, the detected operation temperature of the battery, and a number of charge cycles of the battery.

The present invention further provides an estimating method for battery capacity, which is applied in an electronic device having a battery, the estimating method comprising steps of: determining whether a current or an average current of the battery is zero, if so, performing a process of estimating a remaining capacity, and if not, performing a process of estimating a full charge capacity; performing the process of estimating the remaining capacity, comprising: detecting a voltage of the battery; inquiring a reference capacity from a lookup table based on the detected voltage of the battery; and determining whether a previously recorded remaining capacity is less than the reference capacity, returning to the step of determining whether the current or the average current of the battery is zero when the previously recorded remaining capacity is less than the reference capacity, performing a deduction process of a self-consumable capacity at least once for the previously recorded remaining capacity when the previously recorded remaining capacity is greater than the reference capacity so as to obtain a new recorded remaining capacity that is less than the reference capacity, or returning to the step of determining whether the current or the average current of the battery is zero when the deduction process of the self-consumable capacity has finished; and performing the process of estimating the full charge capacity, comprising: performing a charging process for the battery; counting an electric charge capacity for charging the battery by a coulomb counting method to obtain a count capacity of charging and adding the count capacity of charging to the previously recorded remaining capacity to obtain the new recorded remaining capacity; determining whether the battery is fully charged, if so, deducting a previously recorded full charge capacity from the new recorded remaining capacity to obtain a second offset capacity, and if not, continuing to perform the charging of the battery and adding the count capacity of charging to the previously recorded remaining capacity to update the new recorded remaining capacity; and adding the second offset capacity to the previously recorded full charge capacity to estimate a new full charge capacity.

DETAILED DESCRIPTION OF THE PREFERRED EMBODIMENTS

Figure 1:
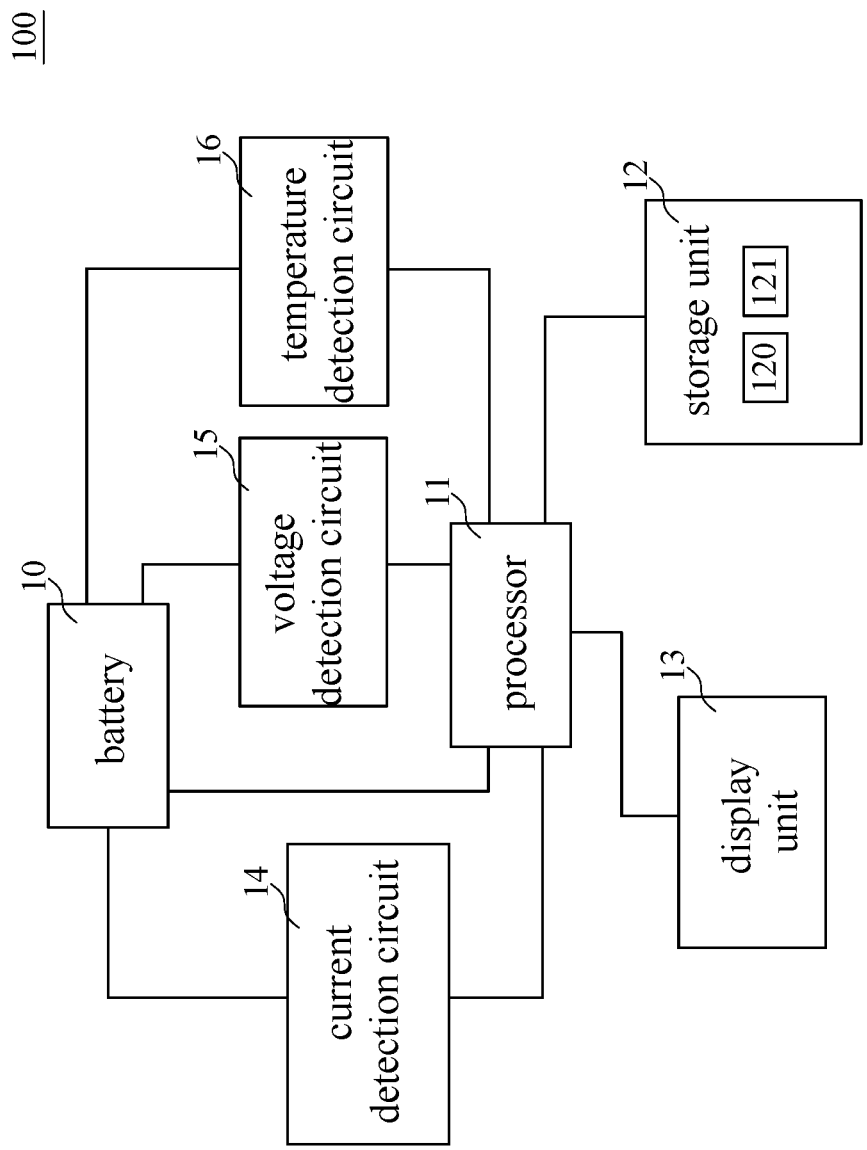
FIG. 1 is a circuit construction diagram of an electronic device according to one embodiment of the present invention.

Referring to FIGS. 1, 2, 3, and 4, there are shown a circuit construction diagram of an electronic device according to one embodiment of the present invention, a flow chart of a method for estimating a capacity of battery of the present invention, a flow chart of a process for estimating a remaining capacity of battery of the present invention, and a flowchart of a process for estimating a full charge capacity of battery of the present invention, respectively. As shown in FIG. 1, the electronic device 100 comprises a battery 10, a processor 11, a storage unit 12, a display unit 13, a current detection circuit 14, and a voltage detection circuit 15. The storage unit 12 stores an estimating program for battery capacity 120, and a lookup table 121, and records a information related for a remaining capacity (RM) and a full charge capacity (FCC) of the battery 10. The electronic device 100 of the present invention can perform a process for estimating the remaining capacity (RM) of the battery 10 or a process for estimating the full charge capacity (FCC) of the battery 10, so as to update the remaining capacity (RM) recorded or the full charge capacity (FCC) recorded. Besides, the recorded remaining capacity (RM) or the recorded full charge capacity (FCC) will be stored in the storage unit 12 or presented on the display unit 13.

Figure 2:
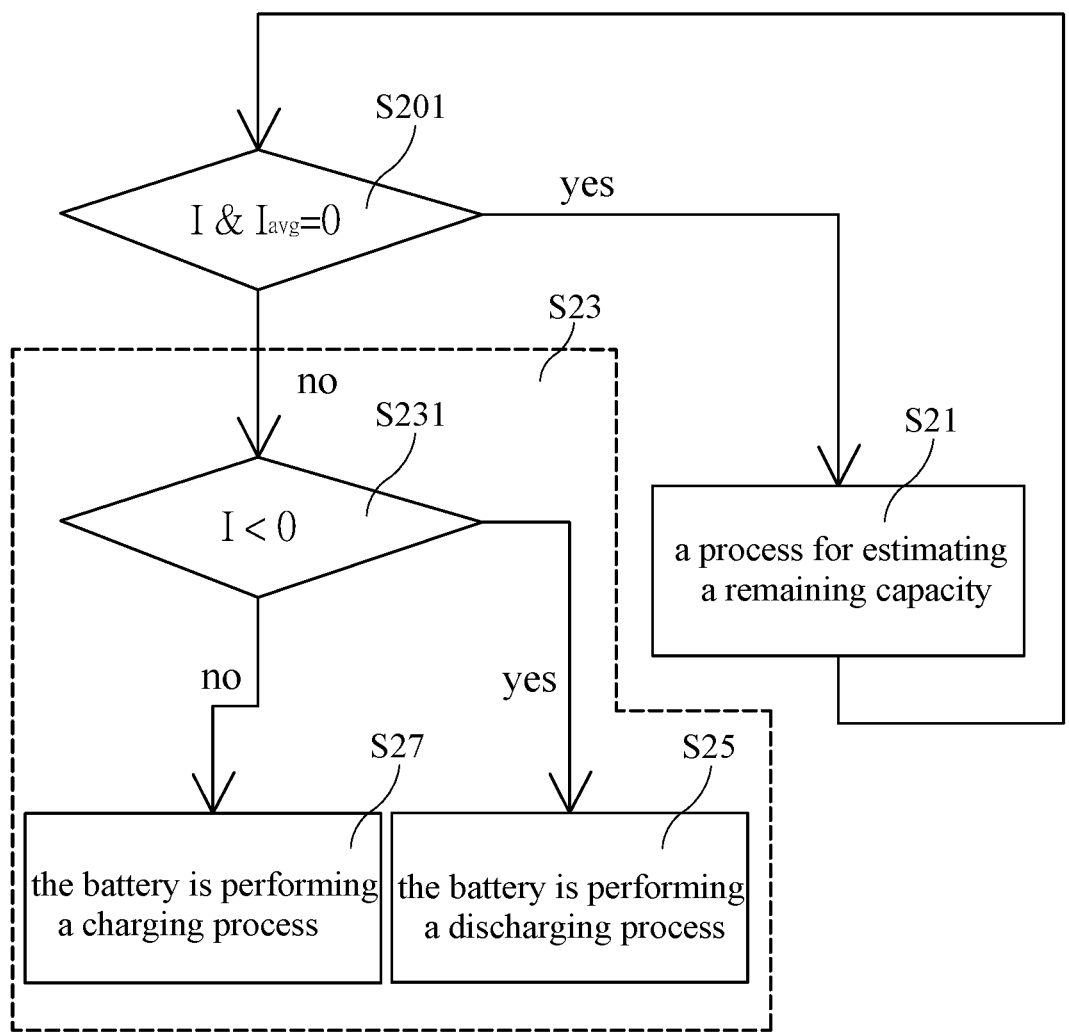
FIG. 2 is a flow chart of a method for estimating a capacity of battery of the present invention.

As shown in FIG. 2, the flow chart of the method for estimating the battery capacity of the present invention is described in the following. In step S201, firstly, the processor 11 starts the estimating program 120 of battery capacity, the current detection circuit 14 detects a current (I) of the battery 10, and determines whether the current (I) or the average current ($I_{avg}$) of the battery 10 is zero. If the current (I) or the average current ($I_{avg}$) of the battery 10 is zero, it indicates that the battery 10 has not be charged or discharged, the estimating program 120 of battery capacity will perform a process S21 for estimating the remaining capacity (RM) of the battery 10. On the contrary, if the current (I) or the average current ($I_{avg}$) of the battery 10 is not zero, it indicates that the battery 10 is charging or discharging, the estimating program 120 of battery capacity will perform a process S23 for estimating the full charge capacity (FCC) of the battery 10.

Figure 3:
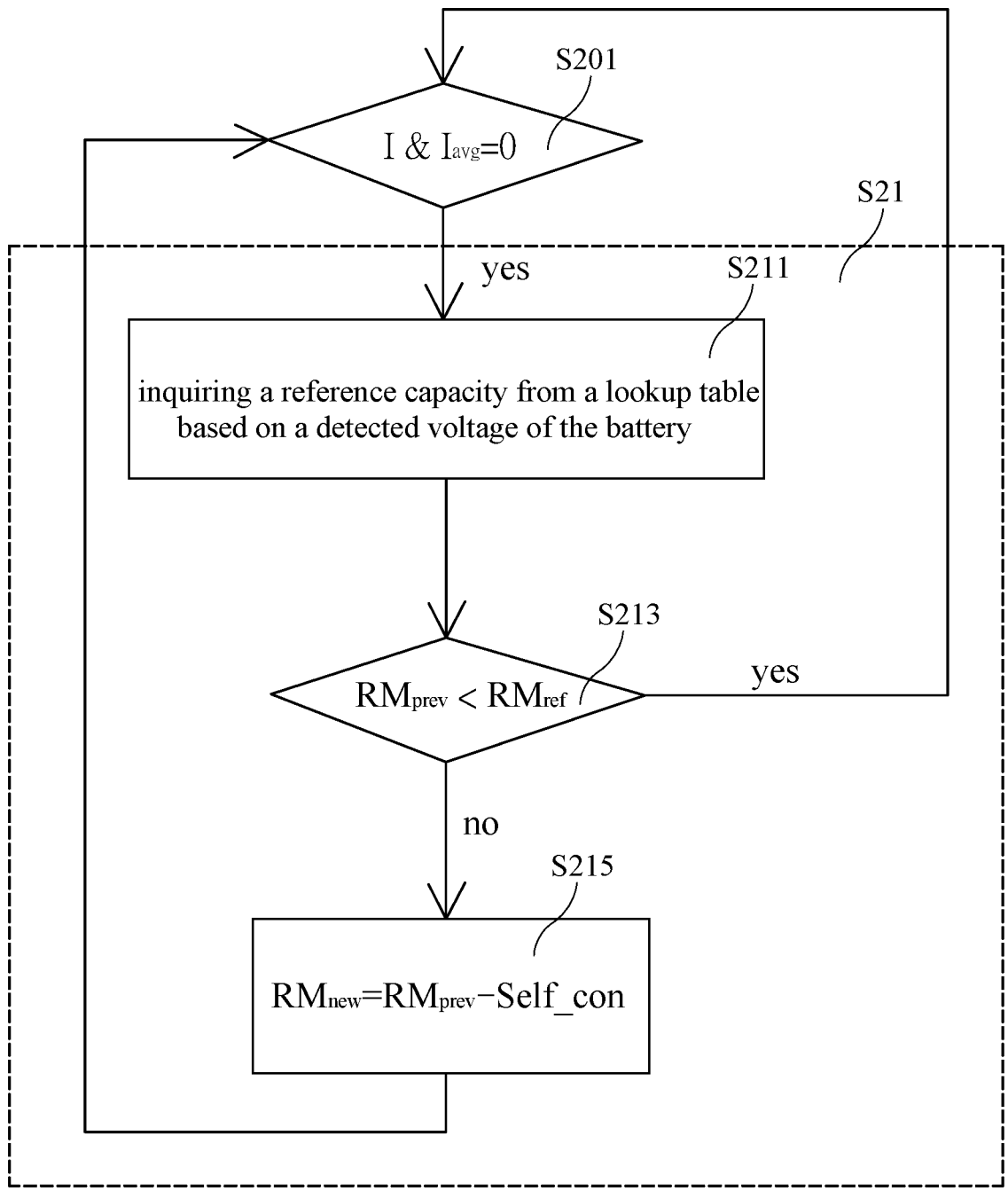
FIG. 3 is a flow chart of a process for estimating a remaining capacity of battery of the present invention.

As shown in FIG. 3, when the process S21 for estimating the remaining capacity (RM) of the battery 10 is performed, firstly, performing step S211, the processor 11 detects a voltage (V) of the battery 10 by the voltage detection circuit 15, and inquiries a corresponding reference capacity ($RM_{ref}$) from the lookup table 121 based on the detected voltage (V). In one embodiment of the present invention, the lookup table 121 is a comparison table of the voltage (V) of the battery 10 and the reference capacity ($RM_{ref}$), and lists each of the voltages (V) of the battery 10 and the corresponding reference capacity ($RM_{ref}$) thereof. For example, the voltage A1 (mV) is corresponding to the reference capacity B1 (mA), the voltage A2 (mV) is corresponding to the reference capacity B2 (mA), the voltage $A_N$ (mV) is corresponding to the reference capacity $B_N$ (mA), etc. Sequentially, performing step S213, the processor 11 determines whether a previously recorded remaining capacity ($RM_{prev}$) is less than the reference capacity ($RM_{ref}$). If the previously recorded remaining capacity ($RM_{prev}$) is less than the reference capacity ($RM_{ref}$), the previously recorded remaining capacity ($RM_{prev}$) does not need to be updated, returning to step S201, the processor 11 continues to determine whether the current (I) or the average current (Ig) of the battery 10 is zero. Otherwise, if the previously recorded remaining capacity ($RM_{prev}$) is greater than the reference capacity ($RM_{ref}$), performing step S215, a deduction process of a self-consumable capacity (Self_con) is performed at least once for the previously recorded remaining capacity ($RM_{prev}$), so as to obtain a new remaining capacity ($RM_{new}$=$RM_{prev}$−Self_con) of the battery 10. In the present invention, the self-consumable capacity (Self_con) is a value for correcting a remaining capacity of the battery 10, and is set as a small unit of value, such as 1 mAh or other value. Afterwards, those steps S201, S211, S213, and S215 are performed, continually, until the new remaining capacity ($RM_{new}$) is less than the reference capacity ($RM_{ref}$). When the deduction process of the self-consumption capacity (Self_con) has completed and the new remaining capacity ($RM_{new}$) has less than the reference capacity ($RM_{ref}$), the new remaining capacity ($RM_{new}$) will be stored in the storage unit 12; afterwards, returning to the step 201, the processor 11 determines whether the current (I) or the average current ($I_{avg}$) of the battery 10 is zero. Accordingly, the remaining capacity recorded, for example, $RM_{new}$, is able to be corrected one or more times by the self-consumption capacity (Self_con) and therefore gradually approached to the reference capacity ($RM_{ref}$) so that the estimation of the remaining capacity (RM) of the battery 10 can be accurate.

Furthermore, the electronic device 100 further comprises a temperature detection circuit 16. The processor 11 is connected to the temperature detection circuit 16, and is able to detect an operation temperature of the battery 10 by the temperature detection circuit 16. In other embodiment of the present invention, the lookup table 121 is a comparison table of the voltage (V) of battery, the operation temperature of battery, and the reference capacity ($RM_{ref}$). Thus, in the step S211, the processor 11 may inquire the reference capacity ($RM_{ref}$) from the lookup table 121 based on the detected voltage (V) of the battery 10 and the detected operation temperature of the battery 10. In another embodiment of the present invention, otherwise, the lookup table 121 is a comparison table of the voltage (V) of battery, the operation temperature of battery, the number of charge cycles of battery, and the reference capacity ($RM_{ref}$). Thus, in the step S211, the processor 11 may inquire the reference capacity ($RM_{ref}$) from the lookup table 121 based on the detected voltage (V) of the battery 10, the detected operation temperature of the battery 10, and the number of charge cycles of the battery 10.

Figure 4:
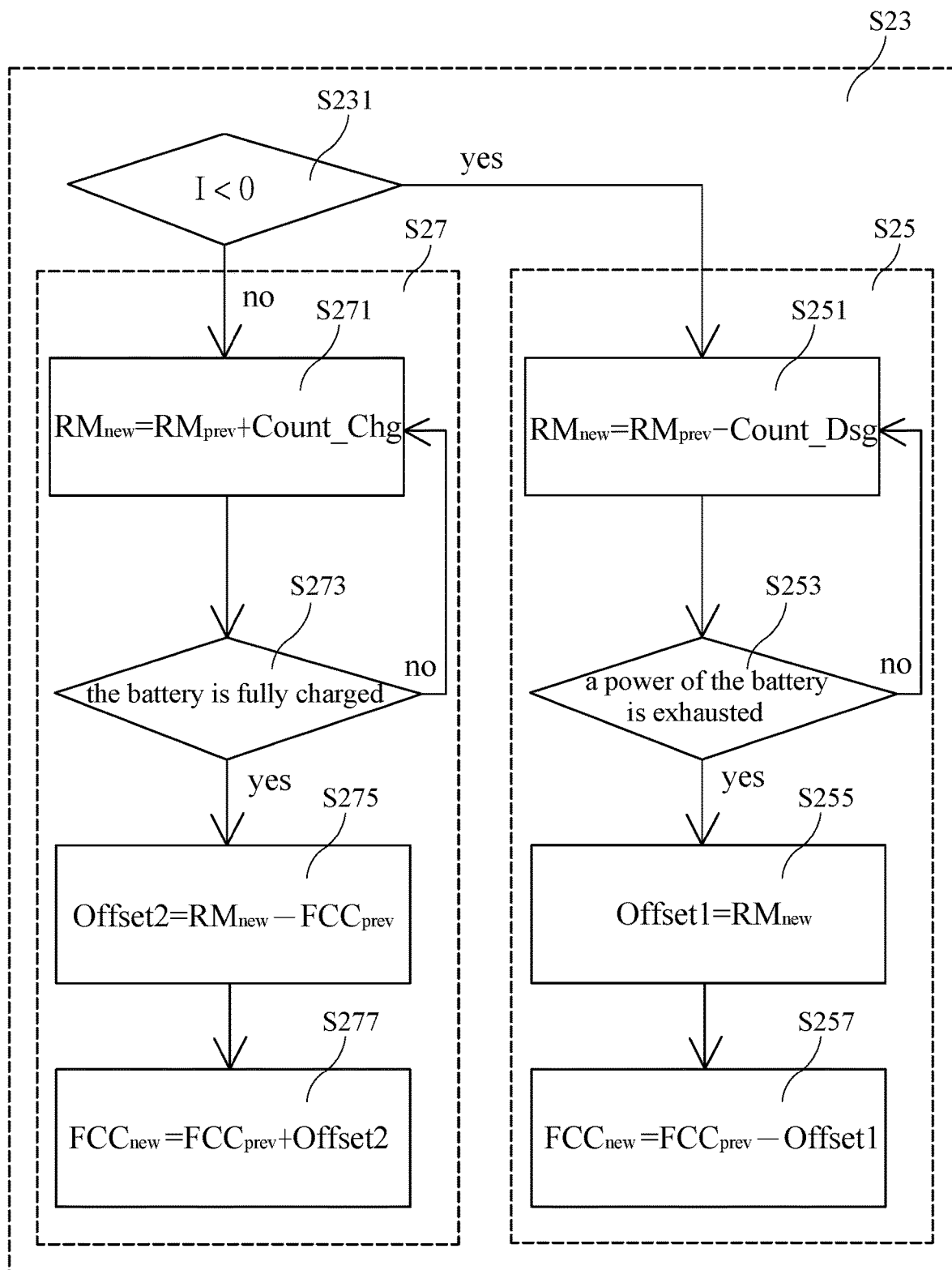
FIG. 4 is a flowchart of a process for estimating a full charge capacity of battery of the present invention.

As shown in FIGS. 2 and 4, returning to the step S201, if the processor 11 determines that the current (I) or the average current ($I_{avg}$) of the battery 10 is not zero, the estimating program 120 of battery capacity will perform a process S23 for estimating the full charged capacity (FCC) of the battery 10. When the process S23 for estimating the full charged capacity (FCC) of the battery 10 is performed, firstly, in step S231, the processor 11 determines whether the current (I) of the battery 10 is less than zero; if so, the battery 10 is performing a discharging process S25, and if not, the battery 10 is performing a charging process S27.

When the battery 10 is performing the discharge process S25, in step S251, the processor 11 counts the electric charge capacity discharged by the battery 10 by a coulomb counting method to obtain a count capacity of discharging (Count_Dsg), and deducts the count capacity of discharging (Count_Dsg) from the previously recorded remaining capacity ($RM_{prev}$) to obtain a new remaining capacity ($RM_{new}=RM_{prev}-$Count_Dsg). Then, continuing to perform step S253, the processor 11 determines whether a power of the battery 10 is exhausted; if the power of the battery 10 has exhausted, performing step S255, the new remaining capacity ($RM_{new}$) will be regarded as a first offset capacity ($Offset_1=RM_{new}$). On the contrary, if the power of the battery 10 is not exhausted, returning to the step S251, the processor 10 continues to perform the discharging of the battery 10 and counts the electric charge capacity discharged by the battery 10 by the coulomb counting method so as to update the remaining capacity ($RM_{new}$), continuously. In step S257, when the first offset capacity ($Offset_1$) is obtained, the first offset capacity ($Offset_1$) is deducted from a previously recorded full charge capacity ($RM_{prev}$) so as to estimate a new full charge capacity ($FCC_{new}=FCC_{prev}-Offset_1$).

Continuing the above described, when the power of the battery 10 has exhausted, the remaining capacity (RM) should be zero; however, it is also possible that the recorded remaining capacity of the battery 10 is not zero due to the inaccuracy of capacity recorded in previous or the aging of battery. If the power of the battery 10 is completely exhausted and the recorded remaining capacity ($RM_{new}$) is a negative value, it represents that the previously recorded full charge capacity ($FCC_{prev}$) underestimates the storage capacity of the battery 10. On the contrary, if the power of the battery 10 is completely exhausted and the recorded remaining capacity ($RM_{new}$) is a positive value, it represents that the previously recorded full charge capacity ($FCC_{prev}$) overestimates the storage capacity of the battery 10. Accordingly, during the discharging process S25, the estimating program 120 of battery capacity of the present invention can calculate the first offset capacity ($Offset_1$) by the estimation of the battery remaining capacity and the use of the coulomb counting method, and offset the previously recorded full charge capacity ($FCC_{prev}$) by the first offset capacity ($Offset_1$) so that an accurate new full charge capacity ($FCC_{new}=FCC_{prev}-Offset_1$) can be estimated.

In the step S231, the battery 10 is performing the charging process S27 if the processor 11 determines that the current of the battery 10 is greater than zero. When the battery 10 is performing the charging process S27, the processor 11 counts the electric charge capacity for charging the battery 10 by the coulomb counting method to obtain a count capacity of charging (Count_Chg), and adds the count capacity of charging (Count_Chg) to the previously recorded remaining capacity ($RM_{prev}$) to obtain a new remaining capacity ($RM_{new}=RM_{prev}+$Count_Chg). Then, continuing step S273, the processor 11 determines whether the battery 10 is fully charged. If the battery 10 has fully charged, performing step S275, the previously recorded full charge capacity ($FCC_{prev}$) is deducted from the new recorded remaining capacity ($RM_{new}$) to obtain a second offset capacity ($Offset_2=RM_{new}-FCC_{prev}$); on the contrary, if the battery 10 is not fully charged, returning to the step S271, the processor 10 continues to charge the battery 10 and counts the electric charge capacity for charging the battery 10 by the coulomb counting method so as to update the new remaining capacity ($RM_{new}$), continuously. In step S277, when the second offset capacity ($Offset_2$) is obtained, the second offset capacity ($Offset_2$) is added to the previously recorded full charge capacity ($FCC_{prev}$) to estimate a new full charge capacity ($FCC_{new}=FCC_{prev}+Offset_2$).

Similarly, continuing the above described, when the battery 10 has fully charged, a difference between the recorded remaining capacity (RM) and the previously recorded full charge capacity ($FCC_{prev}$) should be zero, for example: $RM_{new}-FCC_{prev}=0$; however, it is also possible that the difference between which is not zero due to inaccuracy of capacity recorded in previous or the aging of battery. If the difference between the recorded remaining capacity (RM) and the previously recorded full charge capacity ($FCC_{prev}$) is a negative value, it represents that the previously recorded full charge capacity ($FCC_{prev}$) overestimates the storage capacity of the battery 10. On the contrary, if the difference between the recorded remaining capacity (RM) and the previously recorded full charge capacity ($FCC_{prev}$) is a positive value, it represents that the previously recorded full charge capacity ($FCC_{prev}$) underestimates the storage capacity of the battery 10. Accordingly, during the charging process S27, the estimating program 120 of battery capacity of the present invention can calculate the second offset capacity ($Offset_2$) by the estimation of the battery remaining capacity and the use of the coulomb counting method, and offset the previously recorded full charge capacity ($FCC_{prev}$) by the second offset capacity ($Offset_2$) so that a new full charge capacity ($FCC_{new}=FCC_{prev}+Offset_2$) can be accurately estimated.

Summing up, when the estimating program 120 of battery capacity of the present invention performs the process for estimating the battery remaining capacity, it can correct the recorded remaining capacity (RM) by the lookup table 121 and the self-consumable capacity (Self_con) to estimate an accurate remaining capacity (RM) of the battery 10. Furthermore, when the estimating program 120 of battery capacity of the present invention performs the process for estimating the fully charged capacity, it can calculate the offset capacity (Offset), during the discharging or during the charging, by the remaining capacity estimated and the coulomb counting method, and offset the full charged capacity (FCC) that was erroneously recorded in previously by the use of the offset capacity (Offset) so that the estimation of the full charged capacity (FCC) can be more accurate.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. An estimating method for battery capacity, which is applied in an electronic device having a battery, the estimating method comprising steps of:
   determining whether a current or an average current of the battery is zero, if so, performing a process of estimating a remaining capacity, and if not, performing a process of estimating a full charge capacity;
   performing the process of estimating the remaining capacity, comprising:
      detecting a voltage of the battery;
      inquiring a reference capacity from a lookup table based on the detected voltage of the battery; and
      determining whether a previously recorded remaining capacity is less than the reference capacity, returning to the step of determining whether the current or the average current of the battery is zero when the previously recorded remaining capacity is less than the reference capacity, performing a deduction process of a self-consumable capacity of the battery at least once for the previously recorded remaining capacity when the previously recorded remaining capacity is greater than the reference capacity so as to obtain a new recorded remaining capacity that is less than the reference capacity, or returning to the step of determining whether the current or the average current of the battery is zero when the deduction process of the self-consumable capacity of the battery has finished; and
   performing the process of estimating the full charge capacity, comprising:
      performing a discharging process for the battery;
      counting an electric charge capacity discharged by the battery by a coulomb counting method to obtain a count capacity of discharging and deducting the count capacity of discharging from the previously recorded remaining capacity to obtain the new recorded remaining capacity;
      determining whether a power of the battery is exhausted, if so, the new recorded remaining capacity to be regarded as a first offset capacity, if not, continuing to perform the discharging process for the battery and deducting the count capacity of discharging from the previously recorded remaining capacity to update the new recorded remaining capacity; and
      deducting the first offset capacity from a previously recorded full charge capacity to estimate a new full charge capacity.

2. The estimating method according to claim 1, the process of estimating the full charge capacity further comprising steps of:
   determining whether the current of the battery is less than zero, if so, indicating that the battery is performing the discharging process for the battery, and if not, indicating that the battery is performing a charging process.

3. The estimating method according to claim 2, the steps in which the battery is performing the charging process comprising:
   counting the electric charge capacity for charging the battery by the coulomb counting method to obtain a count capacity of charging and adding the count capacity of charging to the previously recorded remaining capacity to obtain the new recorded remaining capacity;
   determines whether the battery is fully charged, if so, deducting the previously recorded full charge capacity from the new recorded remaining capacity to obtain a second offset capacity, and if not, continuing to perform the charging process for the battery and adding the count capacity of charging to the previously recorded remaining capacity to update the new recorded remaining capacity; and
   adding the second offset capacity to the previously recorded full charge capacity to estimate the new full charge capacity.

4. The estimating method according to claim 1, further comprising the following steps:
   detecting an operation temperature of the battery; and
   inquiring the reference capacity from the lookup table based on the detected voltage of the battery and the detected operation temperature of the battery.

5. The estimating method according to claim 4, further comprising the following steps:
   inquiring the reference capacity from the lookup table based on the detected voltage of the battery, the detected operation temperature of the battery, and a number of charge cycles of the battery.

6. An estimating method for battery capacity, which is applied in an electronic device having a battery, the estimating method comprising steps of:
   determining whether a current or an average current of the battery is zero, if so, performing a process of estimating a remaining capacity, and if not, performing a process of estimating a full charge capacity;
   performing the process of estimating the remaining capacity, comprising:
      detecting a voltage of the battery;
      inquiring a reference capacity from a lookup table based on the detected voltage of the battery; and
      determining whether a previously recorded remaining capacity is less than the reference capacity, returning to the step of determining whether the current or the average current of the battery is zero when the previously recorded remaining capacity is less than the reference capacity, performing a deduction process of a self-consumable capacity of the battery at least once for the previously recorded remaining capacity when the previously recorded remaining capacity is greater than the reference capacity so as to obtain a new recorded remaining capacity that is less than the reference capacity, or returning to the step of determining whether the current or the average current of the battery is zero when the deduction process of the self-consumable capacity of the battery has finished; and performing the process of estimating the full charge capacity, comprising:

performing a charging process for the battery;

counting an electric charge capacity for charging the battery by a coulomb counting method to obtain a count capacity of charging and adding the count capacity of charging to the previously recorded remaining capacity to obtain the new recorded remaining capacity;

determining whether the battery is fully charged, if so, deducting a previously recorded full charge capacity from the new recorded remaining capacity to obtain an offset capacity, and if not, continuing to perform the charging process for the battery and adding the count capacity of charging to the previously recorded remaining capacity to update the new recorded remaining capacity; and adding the offset capacity to the previously recorded full charge capacity to estimate a new full charge capacity.

7. The estimating method according to claim 6, further comprising the following steps:

detecting an operation temperature of the battery; and inquiring the reference capacity from the lookup table based on the detected voltage of the battery and the detected operation temperature of the battery.

8. The estimating method according to claim 7, further comprising the following steps:

inquiring the reference capacity from the lookup table based on the detected voltage of the battery, the detected operation temperature of the battery, and a number of charge cycles of the battery.

\* \* \* \* \*